(12) United States Patent
Richards et al.

(10) Patent No.: US 7,170,122 B2
(45) Date of Patent: Jan. 30, 2007

(54) FERROELECTRIC POLYMER MEMORY WITH A THICK INTERFACE LAYER

(75) Inventors: Mark R. Richards, Tigard, OR (US);
Daniel C. Diana, Portland, OR (US);
Hitesh Windlass, Hillsboro, OR (US);
Wayne K. Ford, Beaverton, OR (US);
Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/676,795

(22) Filed: Sep. 30, 2003

(65) Prior Publication Data

US 2005/0070032 A1    Mar. 31, 2005

(51) Int. Cl.
*H01L 27/10* (2006.01)
(52) U.S. Cl. .......................................... 257/295; 438/3
(58) Field of Classification Search ................ 257/295, 257/310, 534, 535; 438/3
See application file for complete search history.

(56) References Cited

U.S. PATENT DOCUMENTS

| | | | |
|---|---|---|---|
| 6,117,798 A | 9/2000 | Fang et al. | |
| 6,825,060 B1 | 11/2004 | Lyons et al. | |
| 2001/0050869 A1* | 12/2001 | Nishikawa et al. | 365/200 |
| 2003/0017623 A1* | 1/2003 | Li et al. | 438/3 |
| 2004/0209420 A1* | 10/2004 | Ljungcrantz et al. | 438/239 |

OTHER PUBLICATIONS

"Polymer Memory: The plastic path to better data storage," Upstream Spotlight on a Hot Technology to Watch, Technology Review, Sep. 2002, p. 31.

* cited by examiner

*Primary Examiner*—Stephen W. Smoot
(74) *Attorney, Agent, or Firm*—Blakely, Sokoloff, Taylor & Zafman LLP

(57) ABSTRACT

According to one aspect of the invention, a memory array and a method of constructing a memory array are provided. An insulating layer is formed on a semiconductor substrate. A first metal stack is then formed on the insulating layer. The first metal stack is etched to form first metal lines. A polymeric layer is formed over the first metal lines and the insulating layer. The polymeric layer has a surface with a plurality of roughness formations. A second metal stack is formed on the polymeric layer with an interface layer, which is thicker than the heights of the roughness formations. Then the second metal stack is etched to form second metal lines. Memory cells are formed wherever a second metal line extends over a first metal line.

20 Claims, 12 Drawing Sheets

FERROELECTRIC POLYMER MEMORY WITH A THICK INTERFACE LAYER

BACKGROUND OF THE INVENTION

1). Field of the Invention

This invention relates to an electronic assembly and a method of constructing an electronic assembly.

2). Discussion of Related Art

Ferroelectric polymer memory chips, like other integrated circuits, are formed on semiconductor wafers. An insulating layer is typically formed on the wafer first. A lower set of electrodes is formed on the insulating layer over which a polymeric layer is then deposited.

After the polymer is cured and/or annealed, a series of topographic formations, or a "roughness," manifests on the surface of the polymeric layer. These formations can be on the order of the thickness of the substrate and can include valleys, which extend to the lower electrodes and/or insulating layer below.

An upper set of electrodes is then formed on the polymeric layer. The conductive materials, typically metals, used in the upper electrodes are highly reactive with the polymer. If these materials make contact, a chemical reaction may begin which leads to the failure of the device. Typically, an interface layer is formed between the upper electrodes and the polymeric layer to prevent such contact from taking place. However, such interface layers are typically only approximately 50 angstroms thick, and due to the severity of the topography of the polymeric layer, the interface layer is often not thick enough to protect the polymer from reacting with the metals of the upper electrodes.

BRIEF DESCRIPTION OF THE DRAWINGS

The invention is described by way of example with reference to the accompanying drawings, wherein:

FIG. 6b is a side view of an upper surface of the polymer layer on Detail A in FIG. 6a;

DETAILED DESCRIPTION OF THE INVENTION

FIG. 1 to FIG. 8 illustrate a memory array and a method of constructing a memory array. An insulating layer is formed on a semiconductor substrate. A first metal stack is then formed on the insulating layer. The first metal stack is etched to form first metal lines. A polymeric layer is formed over the first metal lines and the insulating layer. The polymeric layer has a surface with a plurality of roughness formations. A second metal stack is formed on the polymeric layer with an interface layer, which is thicker than the heights of the roughness formations. Then the second metal stack is etched to form second metal lines. Memory cells are formed wherever a second metal line extends over a first metal line. Because of the thickness of the interface layer, the polymeric layer is completely separated from rest of the second metal stack.

Figure 1:
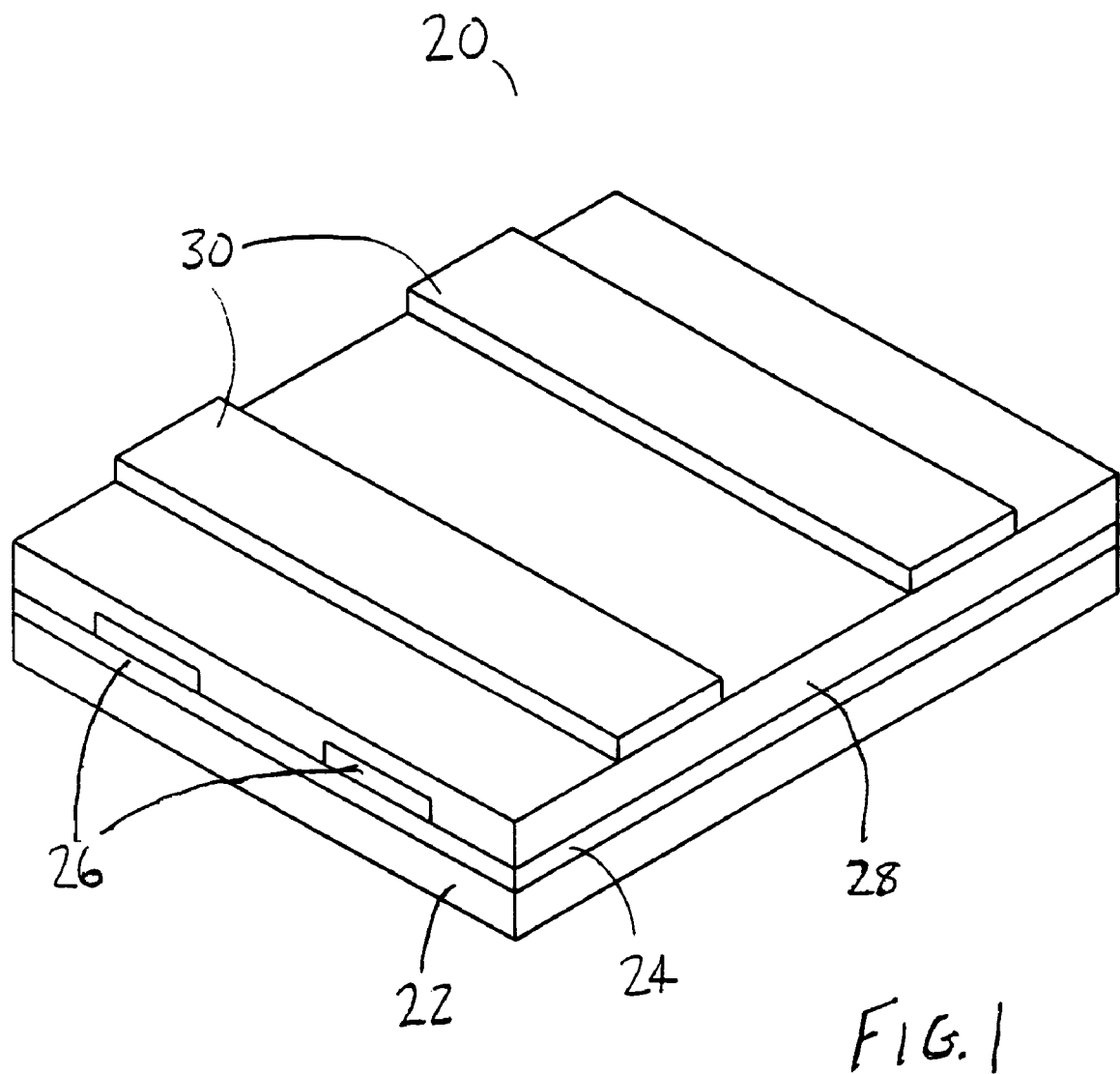
FIG. 1 is a perspective view of a memory array including a substrate, an insulating layer, lower metal lines, a polymer layer, and upper metal lines.

FIG. 1 illustrates a ferroelectric polymer memory array 20. The memory array 20 may include a substrate 22, an insulating layer 24, lower metal lines 26, a polymer layer 28, and upper metal lines 30.

FIGS. 2–8 illustrate a process of making the memory array 20.

Figure 2:
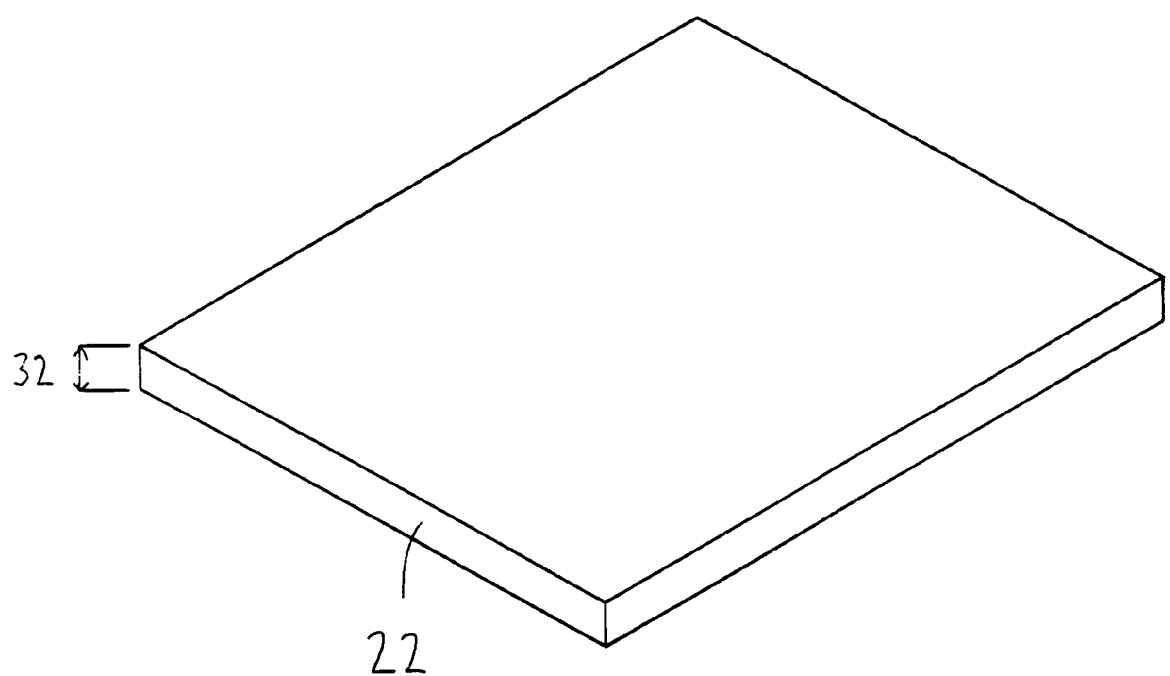
FIG. 2 is a perspective view of the substrate.

FIG. 2 illustrates the substrate 22. The substrate 22 may be made of semiconductor material such as silicon and have a thickness 32 of, for example, approximately 1000 microns. Although as shown the substrate 22 appears to be rectangular, it should be understood that the substrate 22 may be only a portion of a circular silicon wafer, which typically has a diameter of 200 or 300 millimeters. Although not illustrated, the wafer 32 may have a multitude of CMOS circuitry, or other such microelectronic components, formed therein.

It should be noted that FIG. 1 to FIG. 8 are merely illustrative and are not drawn to scale.

Figure 3:
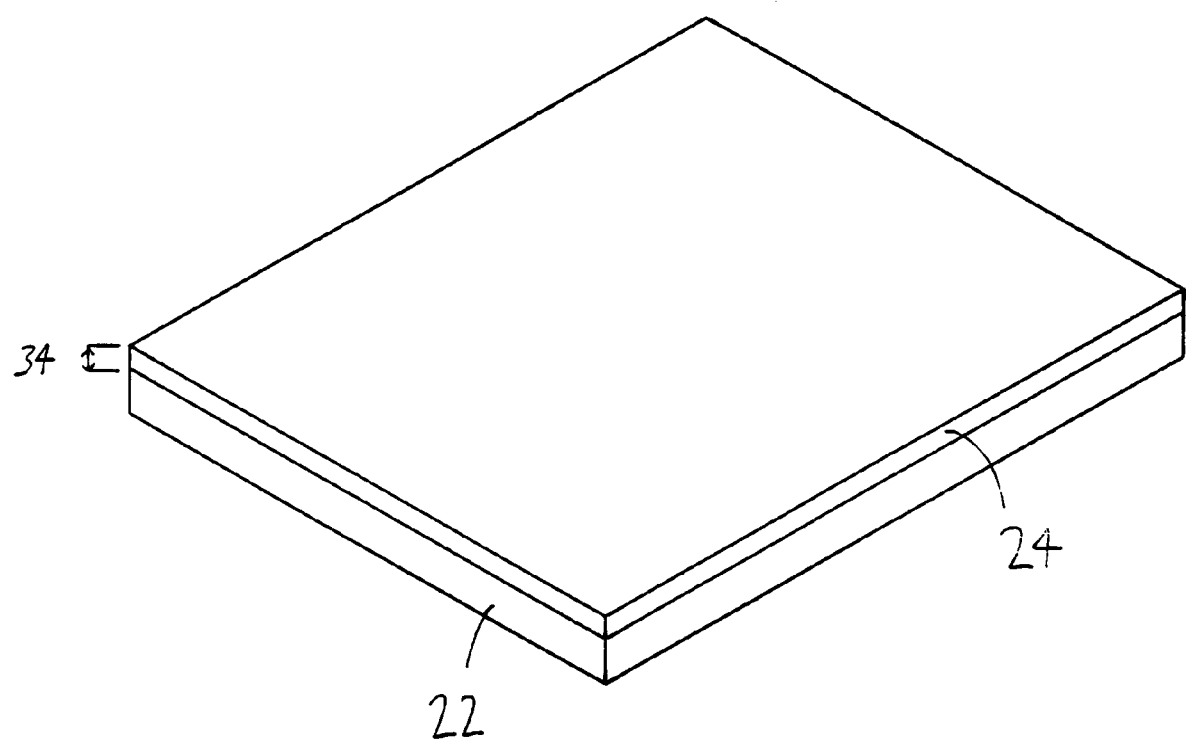
FIG. 3 is a perspective view of the substrate with the insulating layer formed thereon.

Next, as illustrated in FIG. 3, the insulating, or thermal, layer 24 may be formed on the substrate 22. The insulating layer 24 may be made of an insulating, or dielectric material, such as silicon oxide or other thermal oxide, and may have a thickness 34 of, for example, between 500 and 5000 angstroms. The insulating layer 24 may be formed by a deposition process such as chemical vapor deposition (CVD) or thermal growth in a diffusion furnace.

Figure 4A:
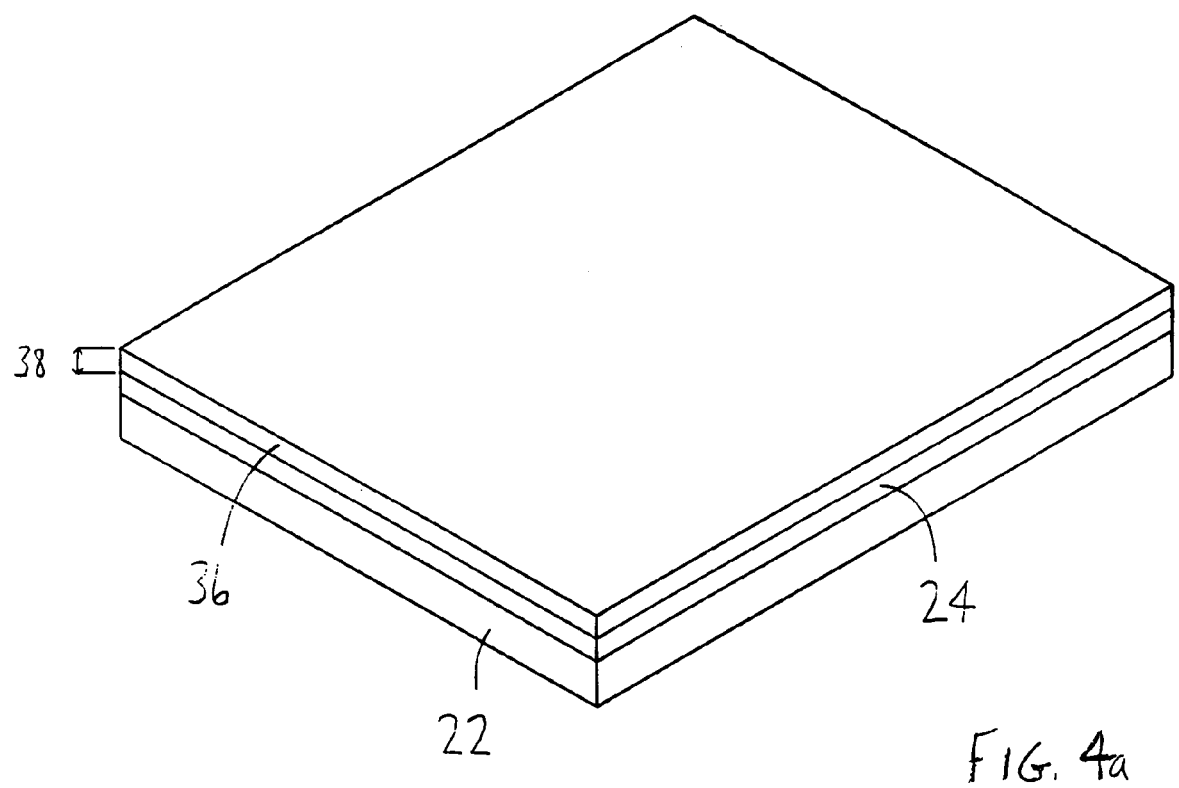
FIG. 4a is a perspective view of the substrate with a first metal stack formed on the insulating layer.
Figure 4B:
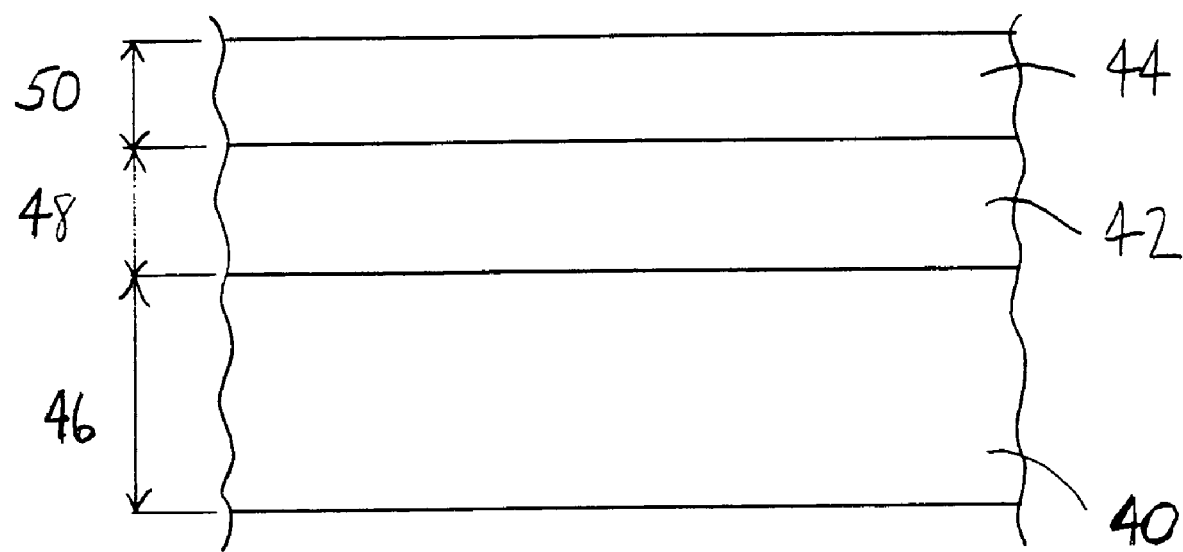
FIG. 4b is a cross-sectional side view of a portion of the first metal stack.

As illustrated in FIGS. 4a and 4b, a lower metal stack 36 may then be formed on the insulating layer 24. The lower metal stack 36 may have a thickness 38 of between 500 and 1000 angstroms, and as shown in FIG. 4b, may include an aluminum layer 40, a titanium layer 42, and a titanium nitride layer 44. The aluminum layer 40 may be sputtered onto the insulating layer 24 and may have a thickness 46, for example, of between 200 and 600 angstroms. The titanium layer 42 may then be sputtered onto the aluminum layer 40 and may have a thickness 48 of, for example, between 100 and 140 angstroms. Next, titanium nitride layer 44 may be sputtered onto the titanium layer 42 and may have a thickness 50 of, for example, between 50 and 100 angstroms.

Figure 5:
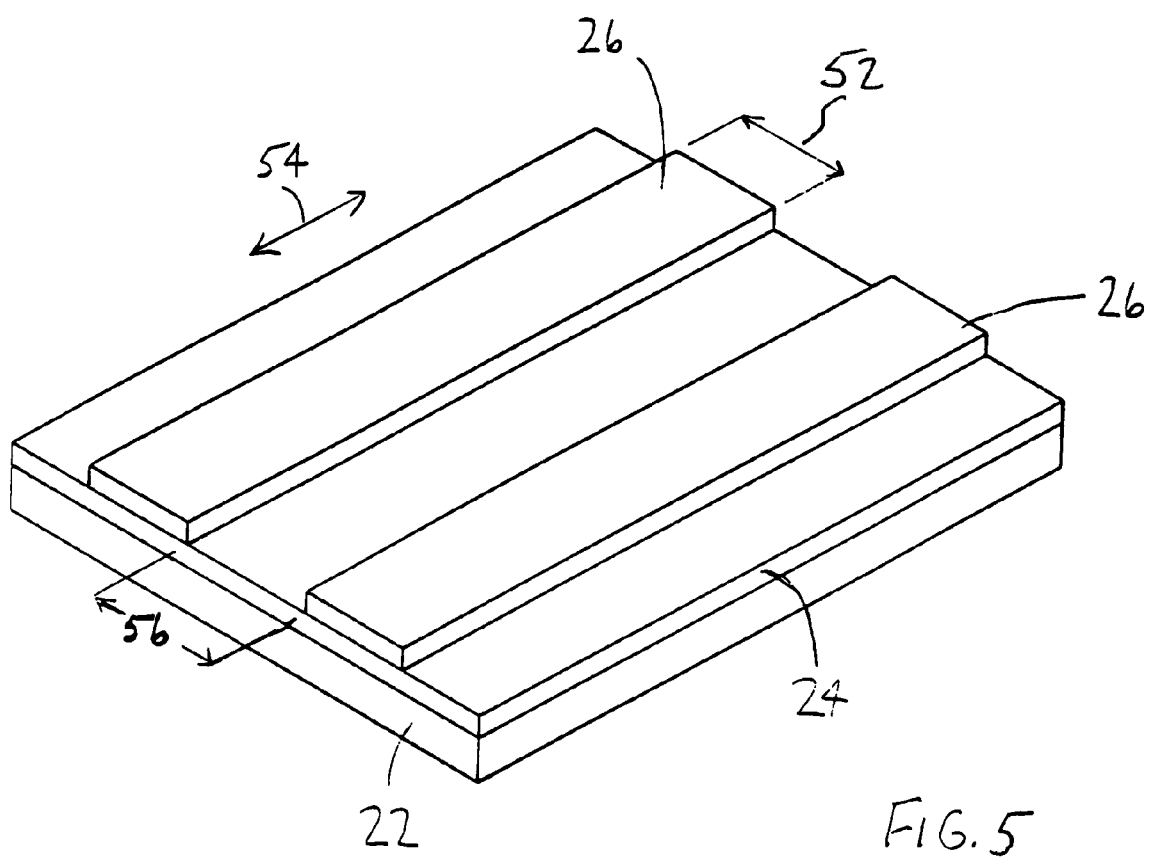
FIG. 5 is a perspective view of the substrate after the first metal stack has been etched leaving behind the lower metal lines.

The lower metal stack 36 may then undergo a conventional photolithography, such as masking a layer of photoresist on an upper surface thereof and exposing the layer, and etch process, leaving behind the lower metal lines 26 as illustrated in FIG. 5. The lower metal lines 26 may have a width 52 of, for example, between 0.15 and 1 micron and extend in a first direction 54. The lower metal lines 26 may lie on a central portion of the thermal layer 24 and may be separated by a distance 56 of, for example, between 0.15 and 1 micron.

As illustrated in FIG. 6, the polymeric layer 28 may then be deposited on the thermal layer 24 and over the lower metal lines 26. The polymeric layer 28 may be made of a copolymer, such as Vinyledene Fluoride (VDF) and Trifluoroethylene (TFE) and have a maximum thickness 58, for example, over the thermal layer 24 of between 600 and 5000 angstroms. The polymer may be mixed with a solvent in which the polymer is considerably soluble, such as diethylcarbonate, and deposited onto the wafer via spin casting. As the wafer spins, excess material may be removed to leave the thickness 58 of the polymeric layer 28 substantially uniform. Further heating of the wafer will evaporate the remaining solvent and leave behind cured and crystallized polymer.

Figure 6A:
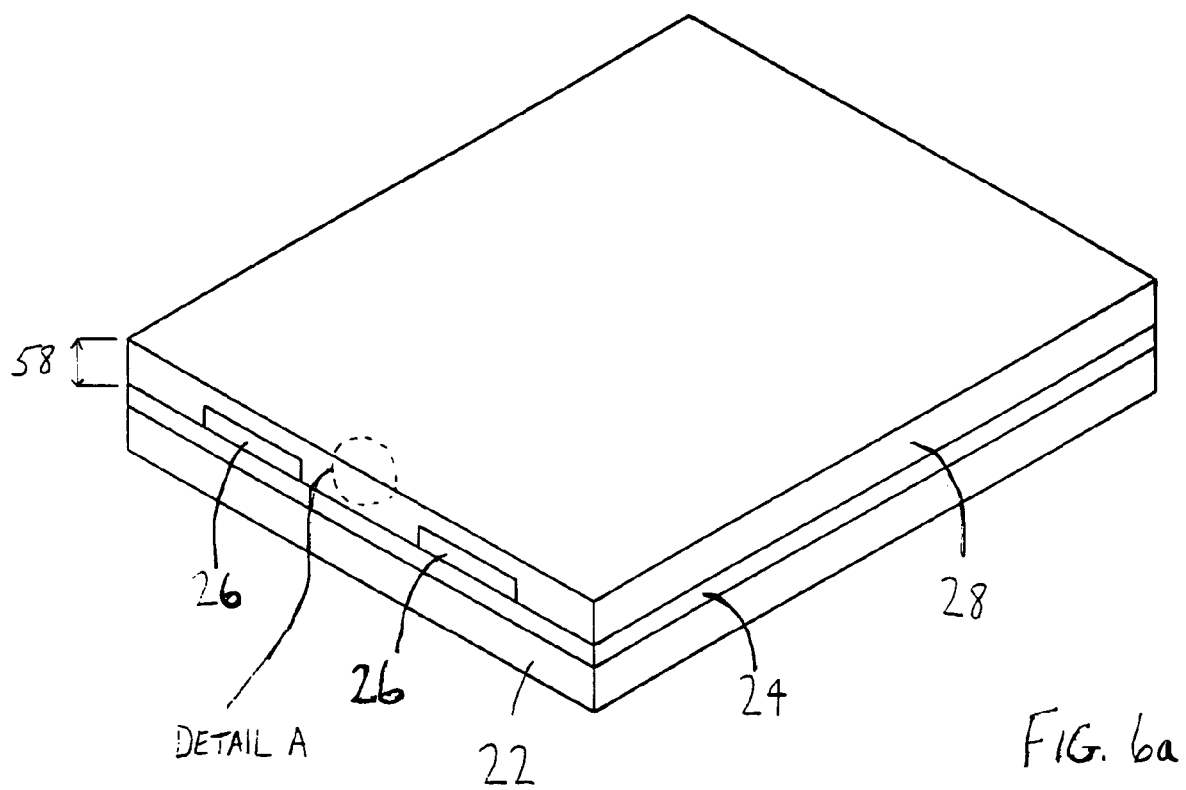
FIG. 6a is a perspective view of the substrate after the polymer layer has been formed over the insulating layer and the lower metal lines.
Figure 6B:
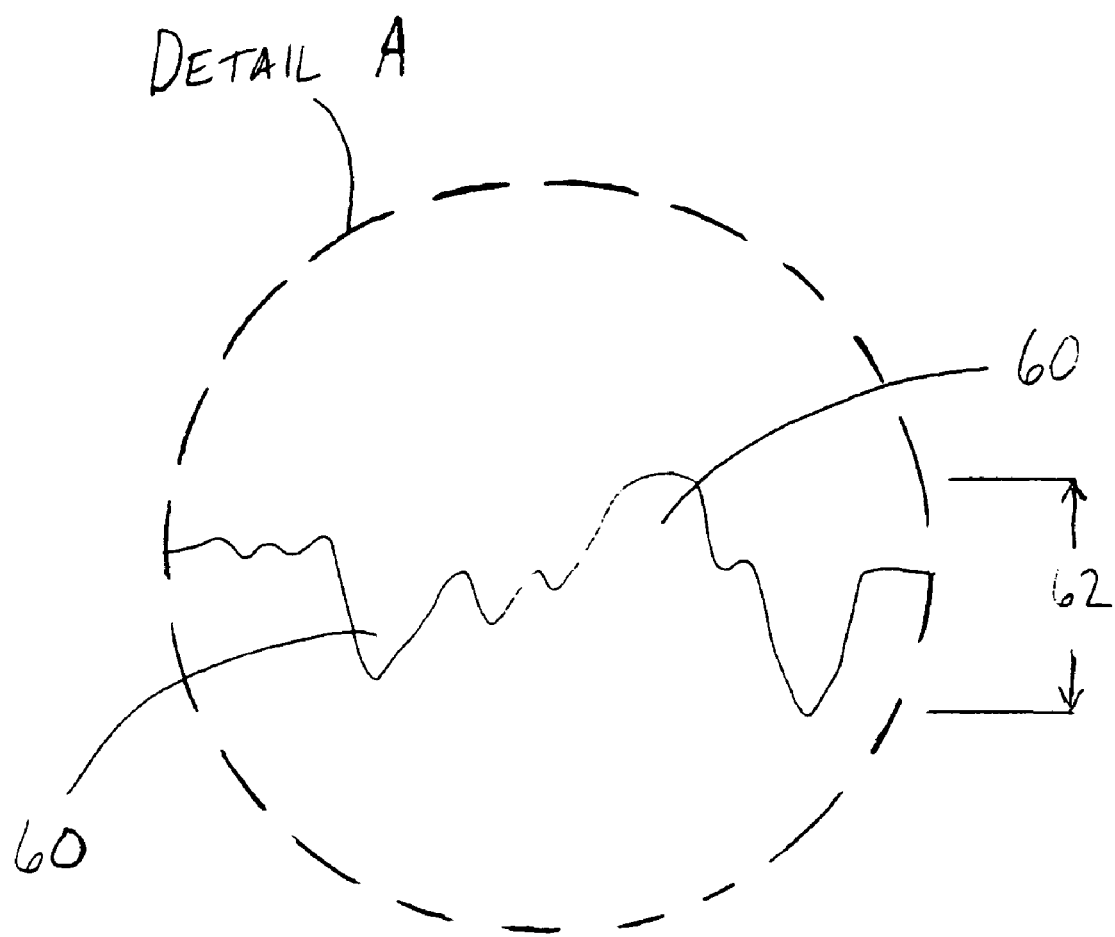

FIG. 6b illustrates Detail A in FIG. 6a and shows an upper surface of the polymeric layer 28. The upper surface of the polymeric layer 28 may not completely smooth but may be covered with a series of topographic, or roughness, formations 60. The formations 60 are a series of raised and recessed areas and may have features with heights 62 typically of about 150 angstroms. However, the heights 62 can reach up to between 600 and 1000 angstroms. Although not illustrated, the formations 60 in the polymeric layer 28 may be gaps, which extend to the thermal layer 24 or the lower metal lines 26 below.

Figure 7A:
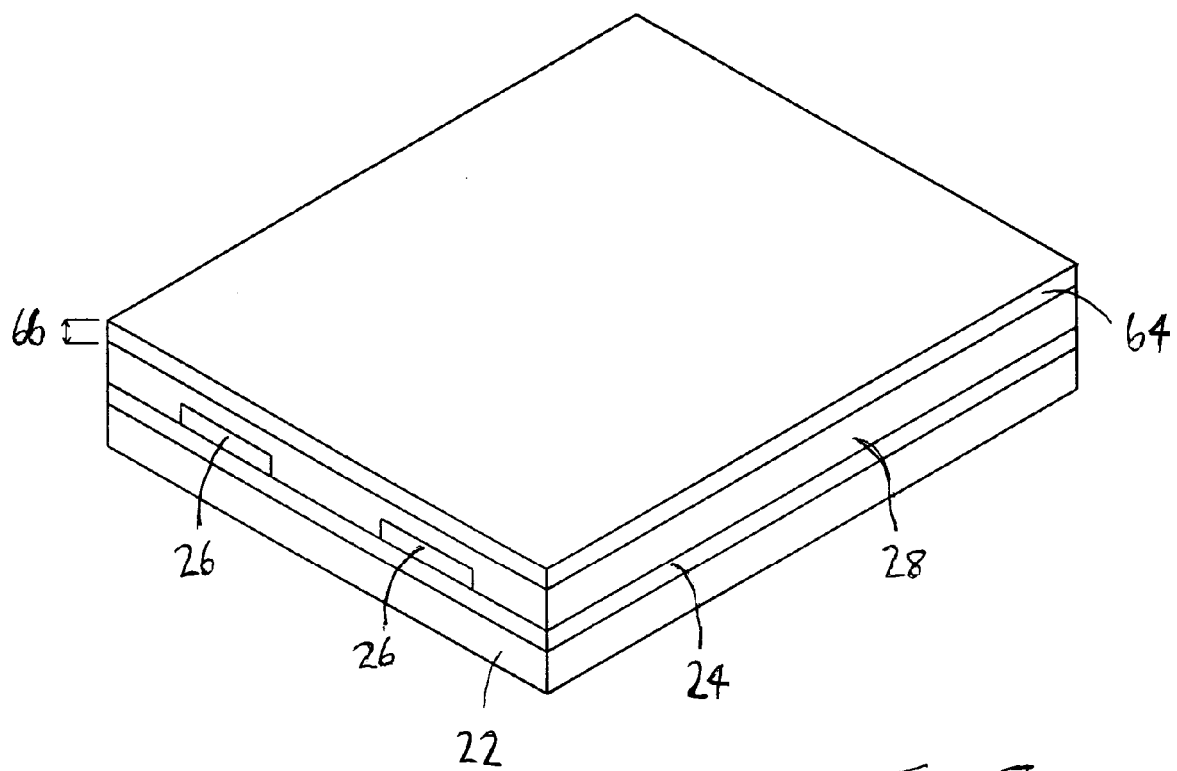
FIG. 7a is a perspective view of the substrate with an upper metal stack formed on the polymer layer.
Figure 7B:
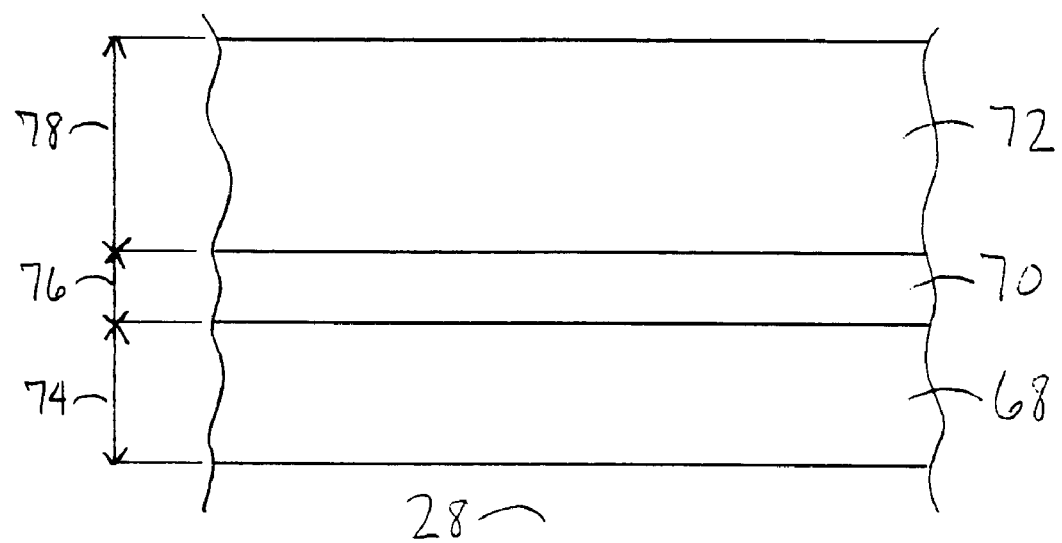
FIG. 7b is a cross-sectional side view of a portion of the upper metal stack.

Next, as illustrated in FIG. 7a, an upper metal stack 64 may be formed on the polymeric layer 28. The upper metal stack 64 may have a thickness 66 of, for example, between 600 and 1000 angstroms, and as illustrated in FIG. 7b, may include, in a preferred embodiment, a titanium oxide layer 68, a titanium layer 70, and an aluminum layer 72. The titanium oxide layer 68, or interface layer, may be formed directly on the polymeric layer 28 by a deposition process, such as atomic layer deposition (ALD), to a thickness 74 of at least 150 angstroms. Then the titanium layer 70 may be formed on the titanium oxide layer 68 by ALD to a thickness 76 of between 30 and 70 angstroms, and the aluminum layer 72 is then formed on the titanium layer 70 by ALD to a thickness 78 of between 200 and 600 angstroms. The titanium oxide layer 68 may be formed such that its thickness 74 is greater than the heights 62 of the topographic formations 60. Because the thickness 74 of the titanium oxide layer 68 is greater than the heights 62 of the formations 60, the other layers of the upper metal stack 64 are completely separated from the polymeric layer 28.

Other methods may be used to form the various layers of the memory array 20 such as thermal evaporation, plating, chemical vapor deposition (CVD), and ion beam sputtering. However, because of the heat generated, sputtering does not work well for forming the upper metal stack 64. Furthermore, other materials may be used in the various layers such as tantalum nitride and tantalum.

Figure 8:
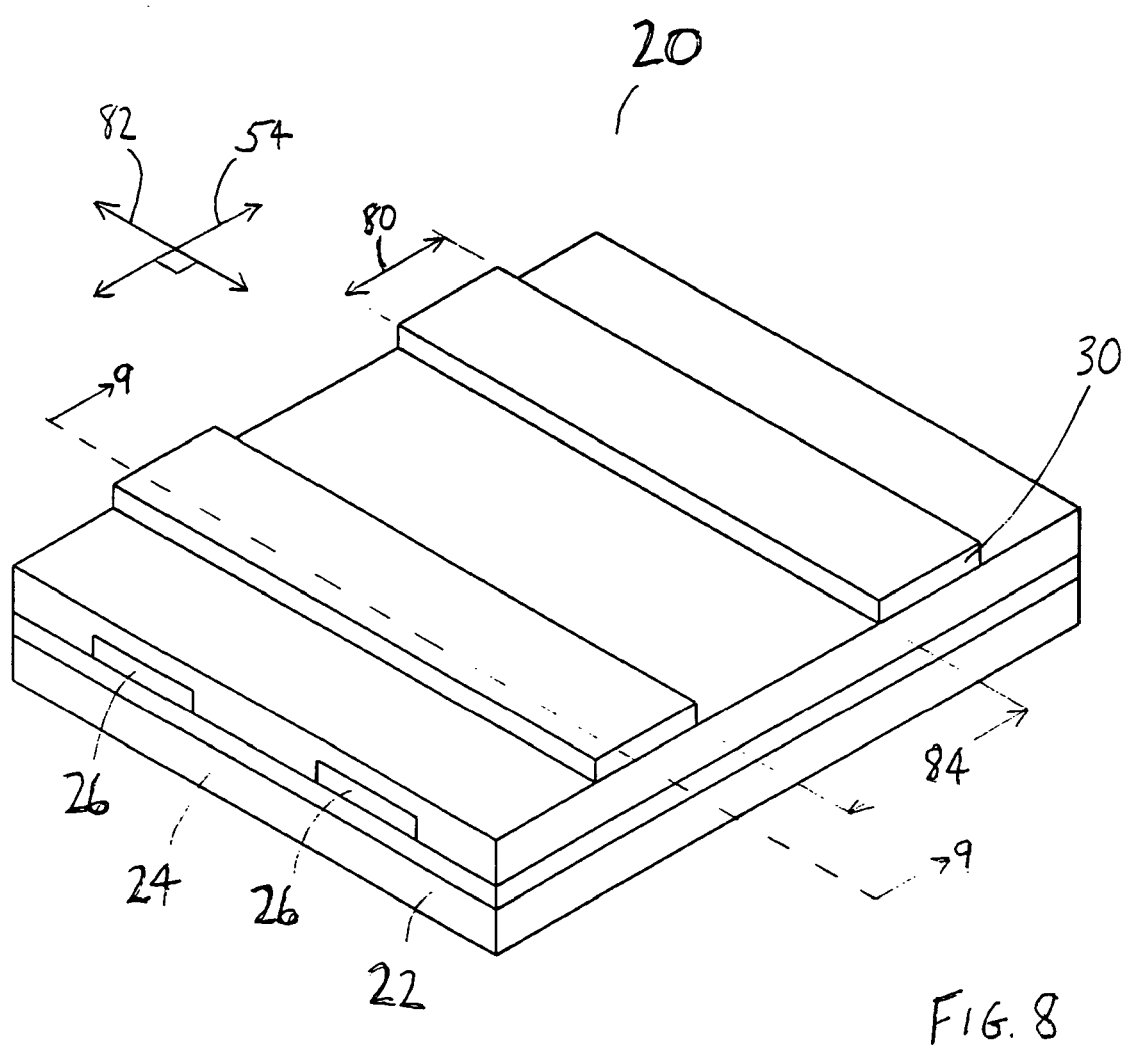
FIG. 8 is a perspective view of the substrate after the upper metal stack has been etched leaving behind the upper metal lines.

The upper metal stack 64 may then undergo a conventional photolithography and etch process leaving behind the upper metal lines 30 as illustrated in FIG. 8. The upper metal lines 30 may have a width 80 of, for example, between 0.15 and 1 micron and extend in a second direction 82, which is perpendicular to the first direction 54. The upper metal lines 30 may lie on a central portion of the upper surface of the polymeric layer 28 and may be separated by a distance 84 of, for example, between 0.15 and 1 micron. FIG. 8 illustrates the completed ferroelectric polymer memory array 20, which contains four memory cells 86.

Figure 9:
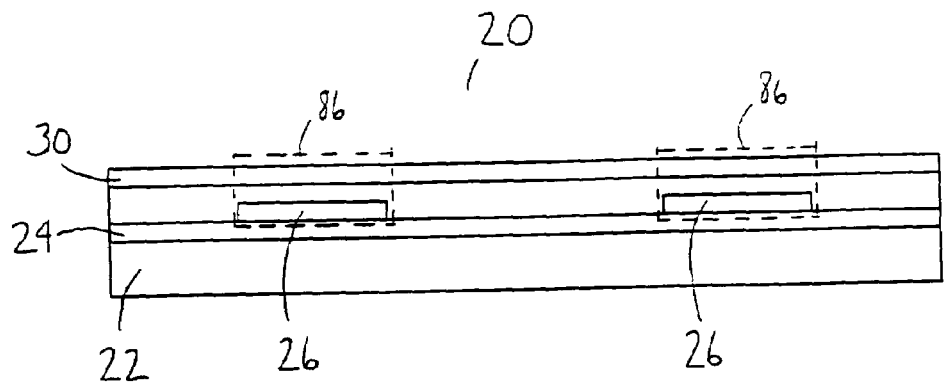
FIG. 9 is a cross-sectional side view on 9—9 in FIG. 8 of the memory array including two memory cells.

FIG. 9 illustrates two memory cells 86 of the memory array 20. Each upper metal line 30 may cross over both lower metal lines 26. Each memory cell 86 may be formed by sections, or portions, of the upper 30 and the lower 26 metal lines, which directly oppose each other with a section of the polymeric layer 28 lying between.

Figure 10:
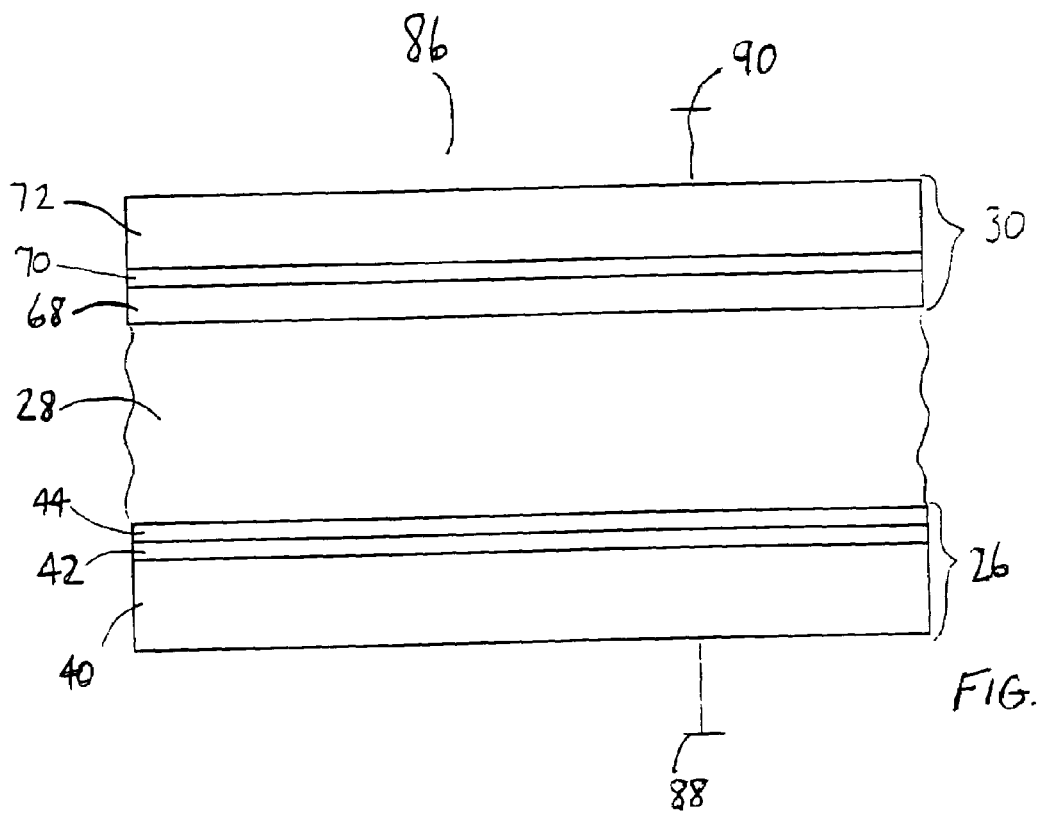
FIG. 10 is a cross-sectional side view of one of the memory cells.

FIG. 10 illustrates one of the memory cells 86. The memory cells 86 include a section of a lower metal line 26, a section of the polymeric layer 28 and a section of an upper metal line 30. The sections of the lower metal lines 26 include the aluminum 40, titanium 42, and titanium nitrate 44 layers that were formed in the lower metal stack 36. The sections of the upper metal lines 30 include the different layers of titanium oxide 68, titanium 70, and aluminum 72 that were formed in the upper metal stack 64. Although not shown in detail, the titanium oxide layer 68 acts as an interface and completely separates the titanium layer 70 from the polymeric layer 28.

Although the embodiment shown contains only two layers of metal lines and one layer of polymer, it should be understood that the number of levels of the memory array may be increased to "stack" memory cells on top of one another. Although not shown, when the memory arrays on the wafer are complete, the wafer is sawed into individual microelectronic die, which are packaged on package substrates and eventually attached to circuit boards. The circuit boards are typically placed in electronic devices such as computers.

As shown schematically in FIG. 10, the aluminum layer 40 of the lower metal line 26 may be a lower conductive electrode and connected to a first electric terminal 88. The aluminum layer 72 of the upper metal lines 30 may be an upper conductive electrode and connected to a second electric terminal 90.

In use, a first voltage may be applied across the first 88 and second 90 electric terminals. The first voltage may cause the dipoles contained in the polymer to align themselves in a particular orientation. After the first voltage is released from the first 88 and second 90 electric terminals, the polymer retains the orientation of the dipoles therein, and thus the polymer located between the lower 26 and upper 30 metal lines maintains a charge. A second voltage, of an opposite polarity, may be applied across the first 88 and second 90 electric terminals to reverse the orientation, and therefore the charge, of the dipoles within the polymer. The presence or absence of a particular charge in one of the cells 86 may be used to store either a 0 or a 1 of a memory bit. Other electric signals may be sent through the first 88 and second 90 electric terminals to detect the charge of the polymer and thus read the memory of the bit of information.

One advantage is that the interface layer, because of its thickness, provides a complete separation between the polymeric layer and the electrodes. Thus, the polymeric layer and the electrodes do not make contact and no chemical reaction between the two takes place. Therefore, the reliability and longevity of the memory array are improved. Another advantage is that the charge retention performance of the memory array is improved.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:

1. A memory cell comprising:
    two electrodes;
    a polymeric body, between the electrodes, having a plurality of roughness formations on a surface thereof, the roughness formations having a height, the polymeric body having a property capable of maintaining a charge after a voltage is applied across the electrodes; and a first interface material having a first portion and a second interface material having a second portion, the first portion being between one of the electrodes and the surface of the polymeric body and having a first thickness that is greater than the height of the roughness formations, the second portion being between the other electrode and an opposing surface of the polymeric body and having a second thickness that is less than the first thickness.

2. The memory cell of claim 1, wherein the polymeric body maintains a second charge after a second voltage is applied across the electrodes.

3. The memory cell of claim 2, wherein the first portion of the first interface material completely separates one electrode and the polymeric body.

4. The memory cell of claim 3, wherein the thickness of the first portion of the first interface material is at least 150 angstroms.

5. The memory cell of claim 4, wherein the electrodes are metal.

6. The memory cell of claim 5, wherein the electrodes are made of at least one of titanium nitride, titanium, and aluminum.

7. The memory cell of claim 6, wherein the polymeric body is ferroelectric.

8. The memory cell of claim 7, wherein the polymeric body includes fluorine.

9. The memory cell of claim 8, wherein the height of the roughness formation is between 600 and 1000 angstroms.

10. The memory cell of claim 6, wherein the first portion of the first interface material is titanium oxide.

11. A semiconductor device comprising:
a substrate;
a first layer, on the substrate, having a plurality of first conductive lines therein;
a second layer, on the first layer, having a plurality of lower interface sections, each lower interface section being over at least a portion of at least one of the first conductive lines, each lower interface section having a first thickness;
a third layer, on the second layer, having a plurality of polymeric sections, each polymeric section being over at least a portion of at least one of the lower interface sections, the polymeric sections having a plurality of roughness formations on a surface thereof, the roughness formations having a height;
a fourth layer, on the third layer, having a plurality of interface upper sections, each upper interface section being adjacent to at least one of the polymeric sections, each upper interface section having a second thickness that is greater than the height of the roughness formations and the first thickness; and
a fifth layer, on the fourth layer, having a plurality of second conductive lines therein, each second conductive line extending over at least one first conductive line, at least one polymeric section, and at least one upper and lower interface section to form a plurality of memory cells such that a voltage applied across one of the first conductive lines and one of the second conductive lines changes a charge of the polymeric section from a first value to a second value.

12. The semiconductor device of claim 11, wherein the thickness of each interface upper section is at least 150 angstroms.

13. The semiconductor device of claim 12, wherein the substrate is silicon and has microelectronic circuitry formed therein.

14. The semiconductor device of claim 13, further comprising an insulating layer between the substrate and the first layer.

15. The semiconductor device of claim 14, wherein the insulating layer is silicon oxide.

16. The semiconductor device of claim 15, wherein the first and second conductive lines are made of at least one of titanium nitride, titanium, and aluminum.

17. The semiconductor device of claim 16, wherein the polymeric sections are ferroelectric.

18. The semiconductor device of claim 17, wherein the height of the roughness formations is between 600 and 1000 angstroms.

19. The semiconductor device of claim 18, wherein each interface upper section is made of titanium oxide.

20. The semiconductor device of claim 19, wherein said layers are stacked vertically.

* * * * *